United States Patent
Yakura

[11] Patent Number: 6,066,560
[45] Date of Patent: May 23, 2000

[54] NON-LINEAR CIRCUIT ELEMENTS ON INTEGRATED CIRCUITS

[75] Inventor: James P. Yakura, Colorado Springs, Colo.

[73] Assignee: LSI Logic Corporation, Milpitas, Calif.

[21] Appl. No.: 09/072,705

[22] Filed: May 5, 1998

[51] Int. Cl.[7] ............................................... H01L 21/4763
[52] U.S. Cl. ........................ 438/687; 438/627; 438/643; 438/639
[58] Field of Search ..................... 438/687, 627, 438/624, 656, 629, 643, 669, 693, 671

[56] References Cited

U.S. PATENT DOCUMENTS

| | | |
|---|---|---|
| 1,640,335 | 8/1927 | Grondahl . |
| 3,790,870 | 2/1974 | Mitchell .................................. 317/238 |
| 3,890,161 | 6/1975 | Brown ...................................... 136/212 |
| 3,993,411 | 11/1976 | Babcock et al. ......................... 403/271 |
| 5,108,562 | 4/1992 | Duke et al. ......................... 204/129.65 |
| 5,128,008 | 7/1992 | Chen et al. ......................... 204/192.15 |
| 5,225,711 | 7/1993 | Chang et al. ............................ 257/750 |
| 5,401,714 | 3/1995 | Chaudhari et al. ...................... 505/193 |
| 5,470,789 | 11/1995 | Misawa .................................... 438/687 |
| 5,714,418 | 2/1998 | Bai et al. ................................. 438/687 |

OTHER PUBLICATIONS

Boher et al, "Diode R.F. Sputtering of Copper and Copper Oxide Thin Films and Multilayers", Thin Solid Films, 174 (Mar. 1989), pp. 91–98.

Gwynne, Peter, "Back To The Future: Copper Comes of Age", IBM Research, No. 4, 1997, pp. 17–21.

"Solid state", Technology 1998 Analysis & Forecast, IEEE Spectrum, Jan. 1998, pp. 23–24.

Ramo, Joshua C., "Chips Ahoy", Time, Oct. 6, 1997, p. 72.

*Primary Examiner*—Charles Bowers
*Assistant Examiner*—Hsien Ming Lee

[57] ABSTRACT

An electrical interconnection structure on an integrated circuit is provided that has a) a substrate layer; b) a diffusion barrier on the substrate layer; c) a copper layer on the diffusion barrier; and d) a copper oxide layer on the copper layer. Methods of making such an interconnection structure is also provided. Such an interconnection structure may be used as a rectifier to prevent damage of sensitive devices from voltage spikes.

6 Claims, 4 Drawing Sheets

NON-LINEAR CIRCUIT ELEMENTS ON INTEGRATED CIRCUITS

BACKGROUND OF THE INVENTION

In the past, copper interconnects on integrated circuits were not possible due to the diffusion of copper into the silicon substrate that changes the electrical properties of silicon in such a way as to prevent the transistors in the integrated circuits from functioning. Recent developments have proven successful in providing a diffusion barrier between the copper interconnect and the substrate. For example, IBM has developed a damascene process to deposit a diffusion barrier in silicon wafers along with copper. See IEEE Spectrum, January 1998, page 23 and IBM Research, Number 4, 1997, page 17. These developments for the first time allow for the commercial use of copper in integrated circuits.

FIELD OF THE INVENTION

This invention relates to novel copper-based non-linear circuit elements on integrated circuits and processes for making such elements.

SUMMARY OF THE INVENTION

The present invention provides for copper-based non-linear circuit elements on integrated circuits.

Non-linear circuit elements such as copper oxide rectifiers have not been used in integrated circuits, because of previous unsolved problems of copper contaminating the silicon substrate. Because of recent successes in developing effective diffusion barriers between copper and the silicon substrate, the placing of copper-based non-linear circuit elements on integrated circuits are now possible.

Copper oxide rectifiers are used for various purposes including providing a voltage drop and preventing damage of sensitive devices from voltage spikes. These rectifiers are based upon the knowledge that a layer of cuprous oxide on the surface of a copper conductor will permit the passage of electrons from the copper into the oxide, but prevents the passage of electrons from the oxide into the copper.

A number of ways are disclosed herein to manufacture copper-based non-linear circuit elements on integrated circuits.

One method of forming a non-linear circuit element on an integrated circuit comprises the steps of a) applying a diffusion barrier on a substrate; b) depositing a layer of copper onto the diffusion barrier; and c) forming a copper oxide layer on the copper layer. The composition of the copper oxide layer is predominantly $Cu_2O$.

Step c) is preferably performed by depositing a layer of copper oxide or by oxidizing at least a part of the copper layer. More particularly, step c) may comprise the steps of applying a dielectric layer onto the layer of encapsulated copper, applying a resist to define the diode region, applying a pattern to the diode resist, etching through the dielectric layer where the resist is not present until at least a portion of the copper is exposed, removing the resist, depositing a diffusion barrier onto the exposed copper and remaining dielectric layer, etching to selectively remove the diffusion barrier on the copper, and applying a copper oxide layer on the exposed copper.

After forming the copper oxide layer on the copper layer, a chemical-mechanical planarization of the copper oxide layer may be performed. Alternatively, an anisotropic etch such as a plasma etch back of the copper oxide layer may be performed. A liner or diffusion barrier is then deposited. A dielectric layer may finally be applied. The composition of the liner and diffusion barrier may be tantalum, tantalum nitride, titanium nitride, tungsten nitride, titanium silicon nitride, molybdenum nitride, tantalum silicon nitride, silicon nitide, $Cu_x Ge_y$, or CuAl alloy. See Jackson, Broadbent et al., Solid State Technology, March 1998; S. C. Sun, 1997 IEDM; U.S. Pat. Nos. 5,420,069 and 5,430,258, which are all herein incorporated by reference.

The substrate may be preliminarily formed by applying a patterned resist, etching the substrate where the resist is not present, and then removing the resist. A liner is deposited on the substrate. Copper is then deposited on the liner, completely filling narrow trenches but only partially filling wider areas. Copper oxide is then deposited, filling the remaining depth of the wider areas. The manufacture of such a circuit element may comprise the following steps: a) applying a patterned resist on a substrate, b) etching the dielectric layer where the resist is not present, c) removing the resist, d) applying a diffusion barrier on the substrate, e) depositing a layer of copper onto the diffusion barrier, f) forming a copper oxide layer on the copper layer, g) conducting a chemical or mechanical planarization of the copper oxide layer to form a planarized surface, and h) depositing a diffusion barrier layer onto the planarized surface.

Also, in accordance with this invention, an electrical interconnection structure is provided that comprises a) a substrate layer; b) a diffusion barrier on said substrate layer; c) a copper layer on said diffusion barrier; and d) a copper oxide layer on said copper layer. Such an electrical interconnection structure may additionally have a diffusion barrier on the copper oxide layer.

DESCRIPTION OF THE PREFERRED EMBODIMENTS

Figure 1A:
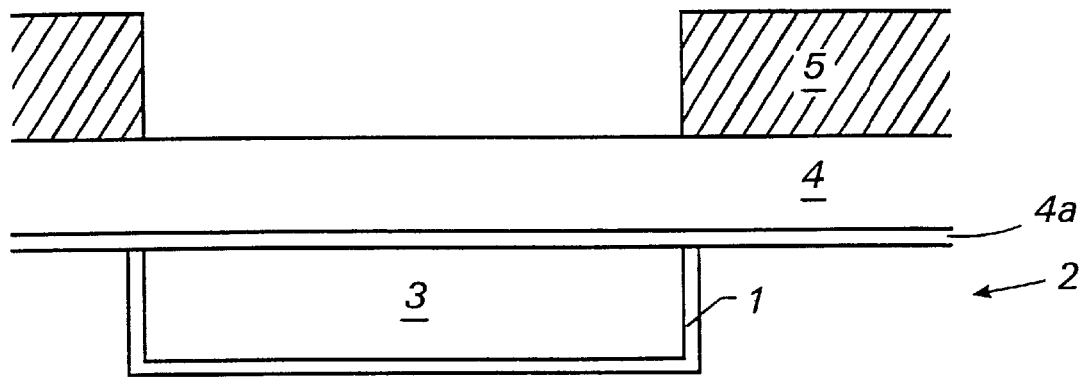
FIGS. 1A through 1E is a processing illustration of the making of a non-linear circuit element on an integrated circuit in accordance with the invention.
Figure 1B:
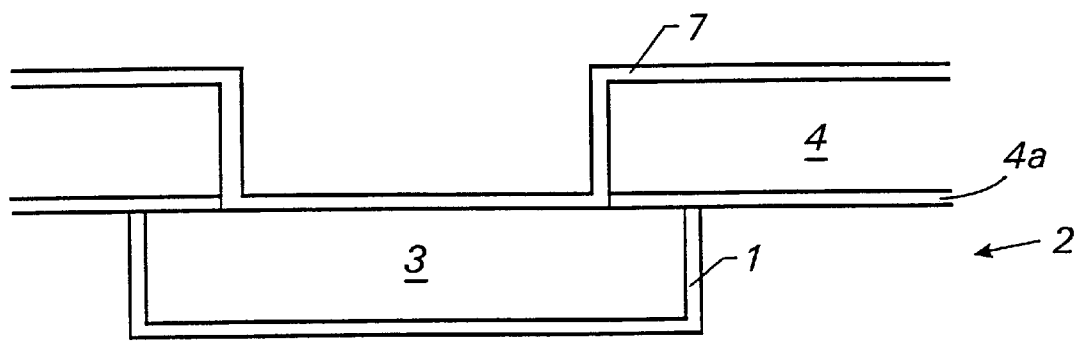
Figure 1C:
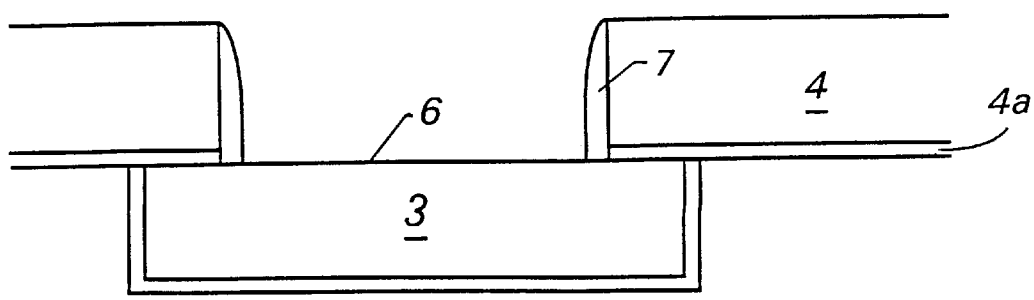
Figure 1D:
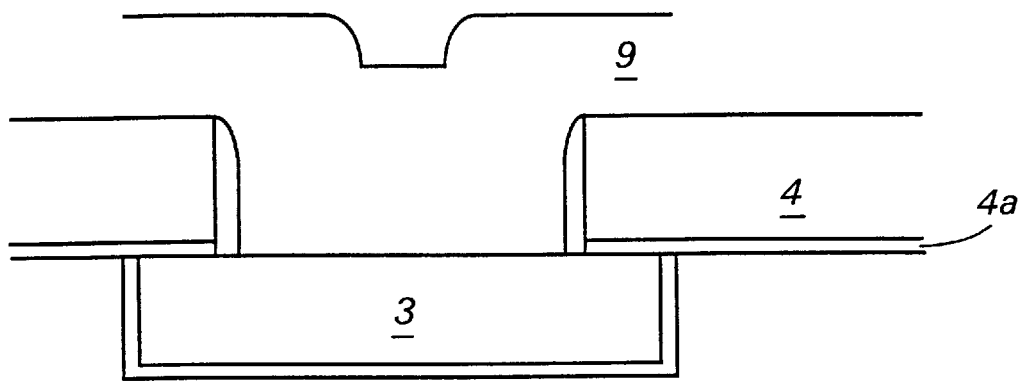
Figure 1E:
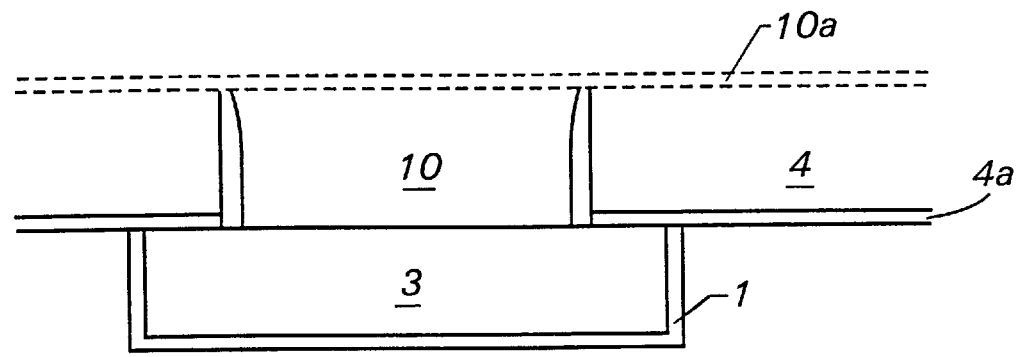

One method of forming a non-linear circuit element on an integrated circuit is shown in FIGS. 1A through 1E. A diffusion barrier (1) is initially applied onto a substrate (2). A copper layer (3) is then deposited onto the diffusion layer, followed by the application of a barrier layer 4a and a dielectric layer (4). A patterned diode resist (5) is then formed on top of the dielectric layer, followed by an etching step that exposes a portion of the copper (6) where the resist is not present. The resist is then removed. Another diffusion barrier (7) is then laid on the exposed portions of the copper as well as on the dielectric layer (4). Preferably, the diffusion barrier (1) is electrically conductive. The diffusion barrier (7) must be an electrical insulator. An anisotropic etch removes the diffusion barrier covering the exposed portions of the copper while leaving the diffusion barrier on the side walls of the dielectric layer (4). Copper oxide (9) is then deposited onto the exposed portions of the copper (6) and the dielectric layer (4). Chemical and mechanical planarization removes the copper oxide (9) on top of the dielectric layer (4) while retaining the copper oxide (10) adjacent to the copper (3). A diffusion barrier layer (10a) is finally deposited on the surface. Preferably, the diffusion barrier layer (10a) is an electrical insulator such as silicon nitride.

In order to form the necessary electrical connection to the non-linear circuit element, the following conventional steps are then performed. A dielectric layer is deposited on top of the diffusion barrier layer (10a). A photoresist is deposited and then patterned. The photoresist is etched down to the diffusion barrier layer (10a), selectively removing the diffusion barrier layer (10a) where the photoresist is not present. An electrically conductive liner is then deposited. Finally, a copper layer is deposited to form an electrical contact with the copper oxide layer (10).

Figure 2A:
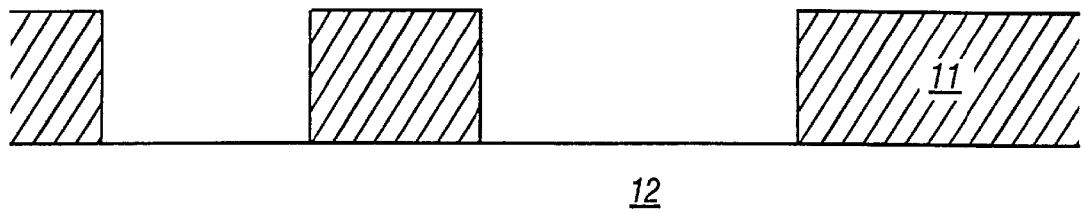
FIGS. 2A through 2D is a processing illustration of a second way of making a non-linear circuit element on an integrated circuit in accordance with the invention.
Figure 2B:
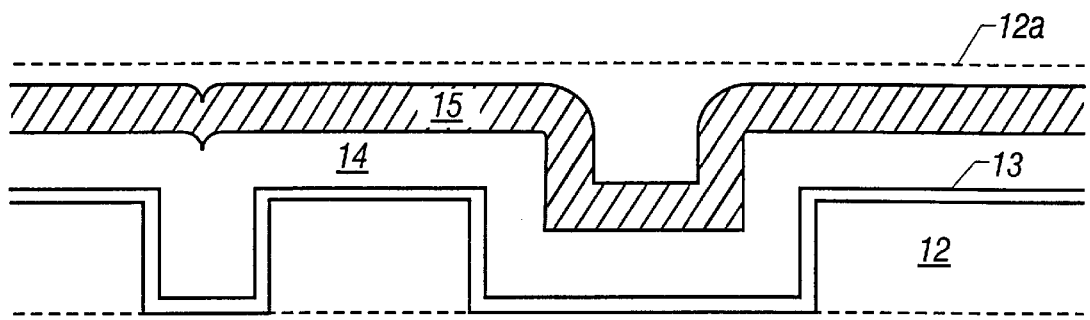
Figure 2C:
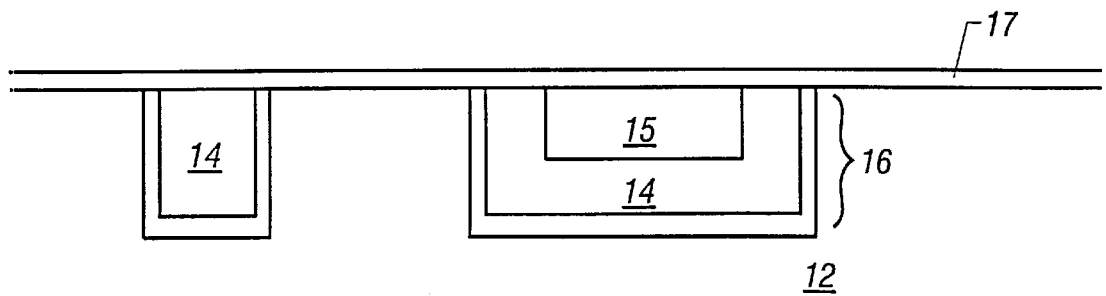
Figure 2D:
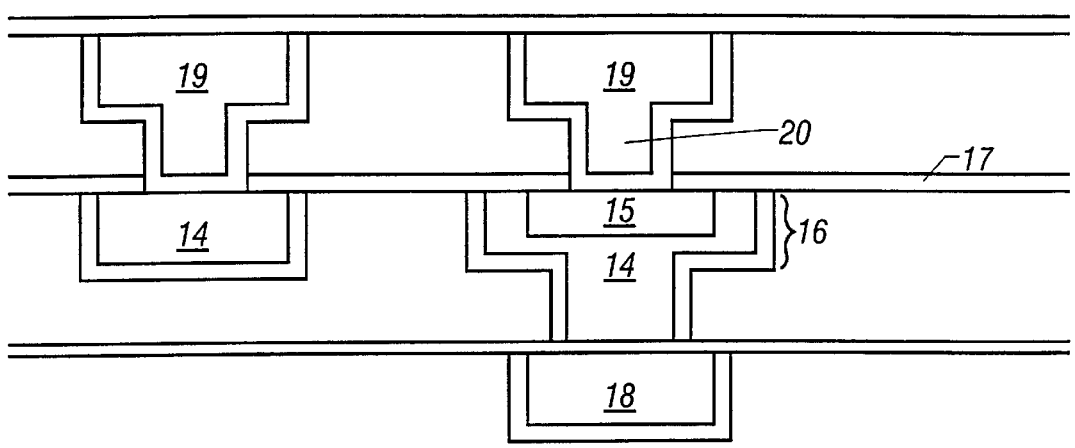

A second method of forming a non-linear circuit element on an integrated circuit is shown in FIGS. 2A through 2D. A resist (11) is applied onto the substrate (12) and then patterned. The substrate is then etched where exposed through the resist and down to the etch stop layer (12a). The resist is then removed. A diffusion barrier or liner (13) is deposited. A layer of copper (14) is then applied. In narrow etched regions or trenches, the copper completely fills the etched regions. Copper oxide (15) is formed and/or deposited onto the copper layer (14). Chemical and mechanical planarization then removes the copper and copper oxide on top of the dielectric layer while retaining the copper and copper oxide/copper portions (16) adjacent to the substrate (12). In wider regions, the copper oxide will remain after planarization. Finally, a diffusion barrier layer (17) that is an electrical insulator is deposited onto the planarized surface.

The structure may then be electrically connected to a lower conductive layer (18) and upper conductive layers (19). A via (20) makes electrical contact with the copper oxide (15).

While there have been described above and illustrated in the drawings various processes and devices in accordance with the invention, it will be appreciated that the invention is not limited thereto, but encompasses all internal forms and modifications falling within the scope of the appended claims.

What is claimed is:

1. A method of forming a non-linear circuit element in an integrated circuit, the method comprising forming a trench in a semiconductor substrate;

forming a first diffusion barrier along a bottom surface and side surfaces of the trench;

at least partially filling the trench with copper; and forming a copper oxide layer on the copper layer.

2. The method of claim 1 wherein forming a copper oxide layer includes oxidizing at least a part of the copper layer.

3. A method of forming a non-linear circuit element in an integrated circuit, the method comprising forming a trench in a semiconductor substrate;

forming a first diffusion barrier along a button surface and side surface of the trench;

at least partially filling the trench with copper; and forming a copper oxide layer on the copper layer, wherein forming a copper oxide layer includes:

forming a dielectric layer over the layer of copper and etching through the dielectric layer to expose at least a portion of the copper layer;

depositing a second diffusion barrier onto the exposed copper layer and remaining dielectric layer;

selectively etching the second diffusion barrier to expose at least a portion of the copper layer, wherein sidewalls of the remaining dielectric layer remain covered by the second diffusion barrier; and providing a copper oxide layer over the exposed copper.

4. The method of claim 3 further including performing chemical-mechanical planarization of the copper oxide layer.

5. The method of claim 3 further including performing an anisotropic etch back of the copper oxide layer.

6. The method of claim 3 wherein the trench is formed by applying a patterned resist, etching the substrate where the resist is not present to form the trench, and removing the resist.

* * * * *